United States Patent
Jung et al.

[11] Patent Number: 6,112,934
[45] Date of Patent: Sep. 5, 2000

[54] PROCESS FOR PRODUCING A UNIT FROM TWO PLASTIC PARTS AND UNIT FORMED THEREBY

[75] Inventors: Oliver Jung, Wuppertal; Siegfried Reichmann, Wermelskirchen; Rudolf Guhs, Königbronn-Zang, all of Germany

[73] Assignee: Robert Bosch GmbH, Stuttgart, Germany

[21] Appl. No.: 09/037,961

[22] Filed: Mar. 11, 1998

[30] Foreign Application Priority Data

Jun. 18, 1997 [DE] Germany .................. 197 25 642

[51] Int. Cl.$^7$ .................. B25D 17/00; B65D 45/02
[52] U.S. Cl. .................. 220/315; 29/418; 220/4.21; 220/265
[58] Field of Search .................. 220/4.21, 4.24, 220/4.26, 4.33, 315, 324, 4.34, 265, 266, 323, 326, 810, 833, 835, 836; 49/38; 264/40.1, 464, 478; 29/418

[56] References Cited

U.S. PATENT DOCUMENTS 4,987,639  1/1991  Baiuley et al. .................. 29/418 X
5,490,604  2/1996  Alexander .

FOREIGN PATENT DOCUMENTS 0 294 080    12/1988  European Pat. Off. .
27 33 964     3/1978  Germany .
PCT/US96/
  09925       6/1996  WIPO .

*Primary Examiner*—Allan N. Shoap
*Assistant Examiner*—Niki M. Eloshway
*Attorney, Agent, or Firm*—Nixon Peabody LLP; David S. Safran

[57] ABSTRACT

An improved process for producing a unit, such as a small plastic housing, from two plastic parts in which a first plastic part is produced in a molding production step and has at least one first connection recess, in which a second plastic part is produced in a molding production step and has at least one second connection recess assigned to the first connection recess. The process is characterized by the two plastic parts being joined together such that the first connection recess and second connection recess are located next to one another and a connector pin is inserted into the two connection recesses thus resulting in a tightly joined unit of the two plastic parts.

9 Claims, 3 Drawing Sheets

PROCESS FOR PRODUCING A UNIT FROM TWO PLASTIC PARTS AND UNIT FORMED THEREBY

BACKGROUND OF THE INVENTION

1. Field of the Invention

The present invention relates to a process for producing a unit from two plastic parts. More specifically, the present invention relates to a process especially applicable for producing small plastic housings used in various applications including small plastic housings for electrical equipment used in motor vehicle construction.

2. Description of Related Art

Processes for producing a unit from two plastic parts, such as a small plastic housing, are known in the art. In the prior art, two plastic parts are produced separately in a molding production process. Each part is provided with a connection region and generally includes at least one elastically resilient snap-in connector which is formed on the two plastic parts. When the two plastic parts are aligned in an position, these snap-in connectors are also aligned so that the aligned connectors may be locked together. There may be a plurality of these snap-in connectors at several locations on the two plastic parts. Thus, when the two plastic parts are aligned and the snap-in connectors of the two parts are locked together, the two plastic parts are also joined together to form the unit.

These "snap-in" designs, however, have material selection limitations if a tight and secure interface between the two plastic parts are required in the unit such that there is no movement or "play" between the plastic parts. If considerable overextension of the snap-in connectors occurs when the plastic parts are locked together, the plastic material selected must have sufficient pre-stressing force to ensure the tightness of the connection of the two plastic parts when the locking position of the snap-in connectors is reached. Therefore, this force requirement limits the type of plastic composition that can be used and special care must be exercised in the selection of the composition of the plastic. Although plastics which have such sufficient pre-stressing force are difficult and costly to design, because the snap-in connection is simple and can be readily manufactured by using uncomplicated molding machines, this process is commonly used in industry to produce units from two plastic parts.

Another process for producing a unit from two plastic parts is known in the area of the production of collapsible shipping boxes as is disclosed in published German Patent Application DE-A-27 33 964. This reference discloses shipping boxes made from two plastic pieces with connection recesses that are situated next to one another when the parts are placed in an position. A hinge pin is inserted in the connection recesses thereby forming a shipping box from the two plastic parts. This production technique, however, results in two plastic pieces being hingeably joined together and does not result in a unit where the plastic parts are joined together tightly, securely and without play. Therefore, there is an unfulfilled need for a process for producing a unit, such as a housing from two plastic parts, where the two plastic parts are held together in a tight and secure interface without movement or "play" between the two parts.

SUMMARY OF THE INVENTION

In view of the foregoing, a primary object of the present invention is to provide a process for producing a unit from two plastic parts, especially for producing small plastic housings.

A second object of the present invention is to provide a process for producing a unit in which the two plastic parts are held together in a tight and secure interface and without movement or "play" between the two parts.

A third object of the present invention is to provide a process for producing a unit wherein the two plastic parts are held together in a tight and secure interface which can be made from a broader range of plastic materials than was previously possible.

Lastly, it is an objective of the present invention to provide a process for producing a unit from two plastic parts which is simplified to minimize the number of slides required on the injection tools.

In accordance with preferred embodiments of the present invention, these objects are obtained by an improved process for producing a unit from two plastic parts wherein the two plastic parts include connection recesses arranged such that, when the two plastic parts are aligned, the connection recesses are located next to one another so that, upon insertion of a connector pin into the connection recesses, the two plastic parts are joined together and the unit formed.

These and other objects, features and advantages of the present invention will become more apparent from the following detailed description of the preferred embodiments of the invention when viewed in conjunction with the accompanying drawings.

DETAILED DESCRIPTION OF THE PREFERRED EMBODIMENTS

Figure 1:
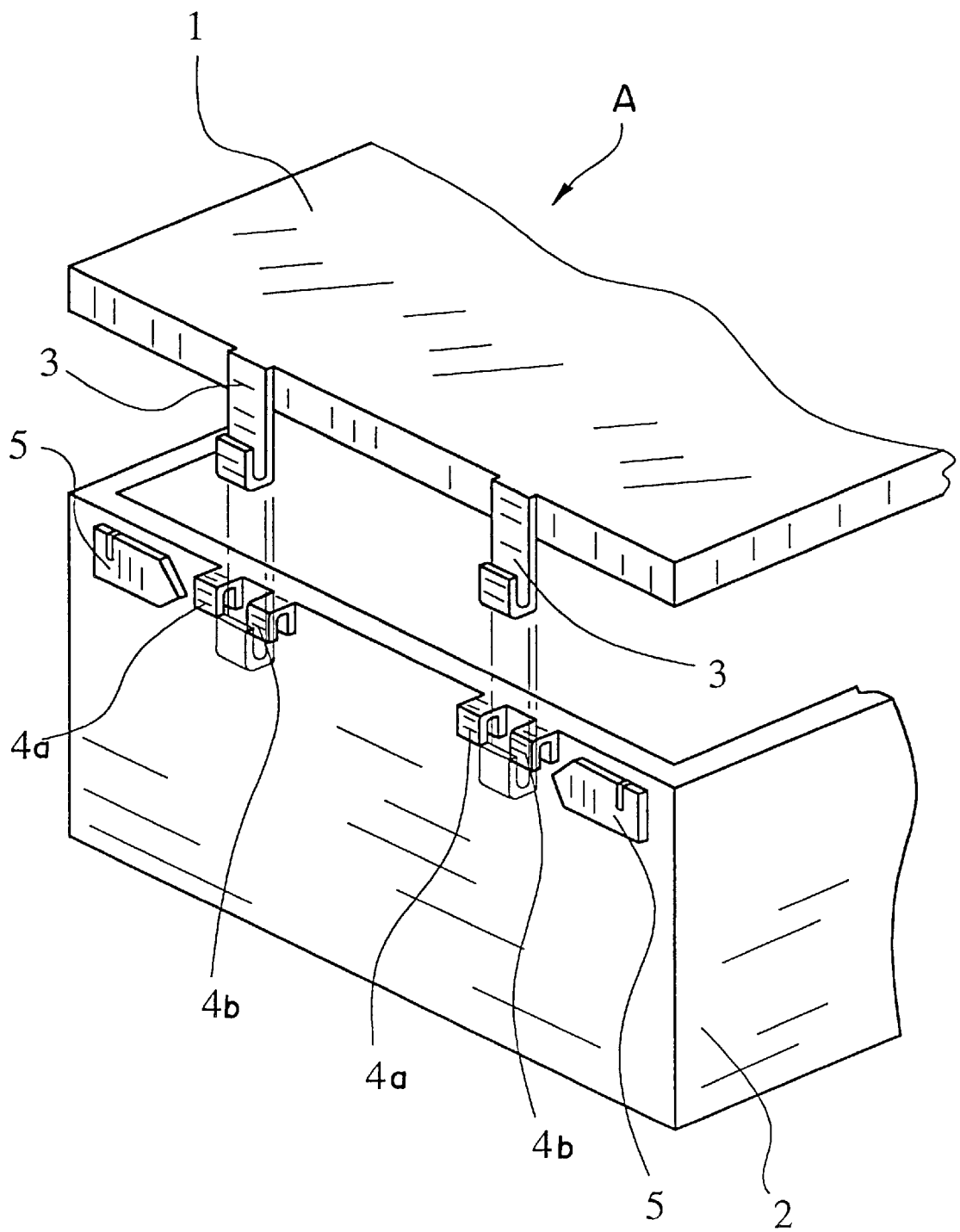
FIG. 1 is a perspective view of the plastic parts of a unit in accordance with a preferred embodiment of the present invention as applied, by way of example, to a small plastic housing, only a portion of which is shown.

FIG. 1 is a perspective view of the plastic parts of a unit in accordance with a preferred embodiment of the present invention comprising two plastic parts, specifically a small plastic housing A comprised of a housing cover 1 and a housing body 2. These small plastic housings can, for example, contain moisture-sensitive electronic modules of an electrical system in a motor vehicle or be used to encapsulate miniature electric motors for servo drives in different environments. Although the present invention is specifically disclosed, by a way of an example, as applied to small plastic housings, the present invention may also be used in any variety of applications that join plastic components and thus, the scope of protection is not limited to the particular application discussed.

In accordance with the preferred embodiment of the present invention, the housing cover 1 includes a plurality of connection recesses 3 in predetermined locations and the housing body 2 includes a plurality of corresponding connection recesses 4a, 4b in predetermined locations which are assigned to a respective connection recesses 3. FIG. 1 also clearly shows a plurality of connecting pins 5 which will be inserted horizontally between the connection recesses 4 of the housing body 2 and the connection recesses 3 of the housing cover 1.

Figure 2:
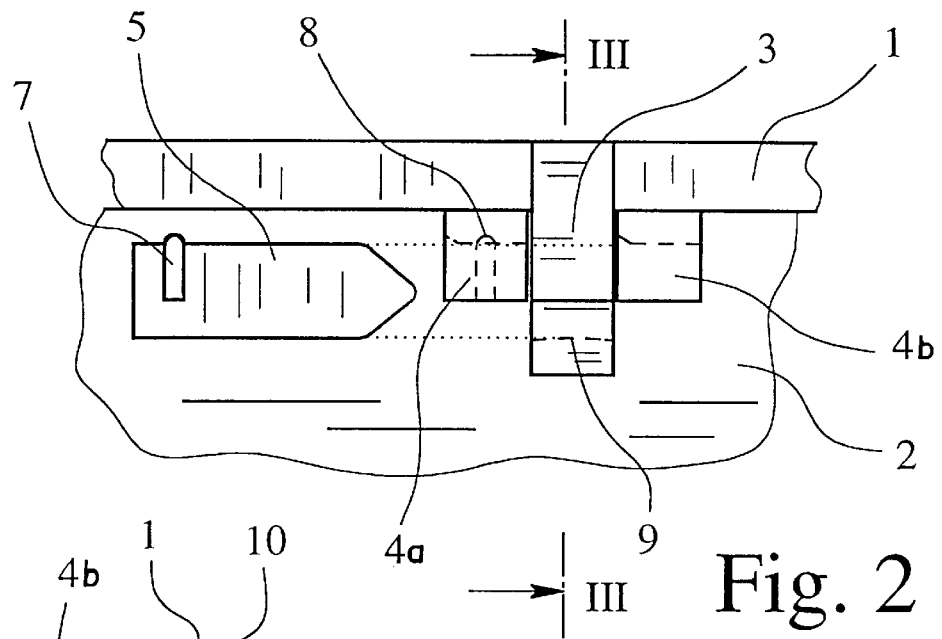
FIG. 2 is an enlarged frontal view of a connection recess and a connecting pin when the plastic parts of the unit are aligned, but not joined.

As can be clearly seen in FIG. 2, the connection recesses on the housing body 2 are arranged as pairs of connection recesses 4a and 4b which are spaced from one another by a distance that is matched to the width of the respective connection recess 3 of the housing cover 1. Thus, this distance allows the respective connection recess 3 to be inserted between the recesses 4a and 4b when the two plastic parts (in this case, the housing cover 1 and the housing body 2) are properly aligned to be joined. Thus, in the present invention, the connection recesses of the plastic parts assigned to one another are not joined together in a snap-in connection but rather, lie next to one another when the two plastic parts are joined.

Figure 3:
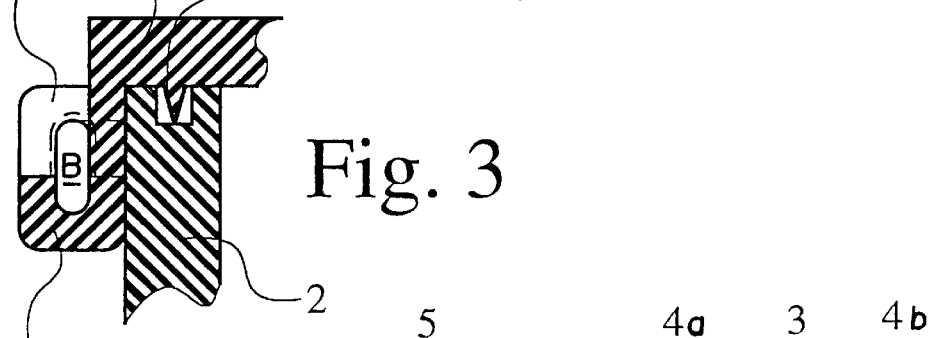
FIG. 3 is a cross-sectional view of the connection recess of FIG. 2 as taken along line III—III therein.

As shown in FIG. 3, when the two plastic parts (in this case, the housing cover 1 and the housing body 2) are properly aligned to be joined, a pin receiving area B is formed by the connection recesses 4a (not shown in this view), 3 and 4b. The connector pin 5 can be axially (or otherwise) inserted through this pin receiving area B in order to join the housing cover 1 and the housing body 2. The joined housing cover 1 and the housing body 2 with the inserted connector pin 5 is clearly shown in FIG. 6. Furthermore, the connector pin 5 can be designed so that its height is slightly greater than the height of the receiving area formed by connection recesses 3, 4a and 4b. Thus, the axial insertion motion of the connector pin 5 creates forces in the connection recess 3 in the opposite direction to forces in the connection recess 4a and 4b and causes the connection recess 3 to "brace" against connection recesses 4a and 4b through the connector pin 5. These "bracing" forces act to clamp the housing cover 1 and housing body 2 together to form a tight and secure interface without movement or "play" and holds the connector pin 5 in place. This embodiment also effectively utilizes the forces required to insert the connector pin 5 by first guiding the connection recess 3 of the housing cover 1 on to the connection recesses 4a and 4b of the housing body 2 while distributing the insertion and bracing forces to the respective members. Because the pre-stressing requirements are not required from the plastic material selected, a broader range of plastic materials may be used in the production of the unit than was previously possible with the snap-in designs. In addition, although it is preferable that the connecting pin 5 be made from the same plastic material as the plastic parts 1 and 2, a different material may also be used.

In the preferred embodiment shown in FIG. 3, a sealing lip 10 as part 1 abuts plastic part 2 to form a seal and is molded on at least one of the plastic parts such as the housing cover 1 to optimize the tightness of the connection of the two plastic parts 1, 2.

To ensure that the connector pin 5 is fixed in the inserted position and that the two plastic parts are held together in a tight and secure interface without movement or "play" when the connector pin 5 is installed, a connection recess can also be provided with a raised arched portion to provide additional clamping force between the housing cover I and the housing body 2. This raised arch portion 9 is clearly shown in FIG. 2 as being designed into the connection recess 3, but it can alternatively be designed into the connection recesses 4a and 4b and/or the connection pin 5.

Figure 6:
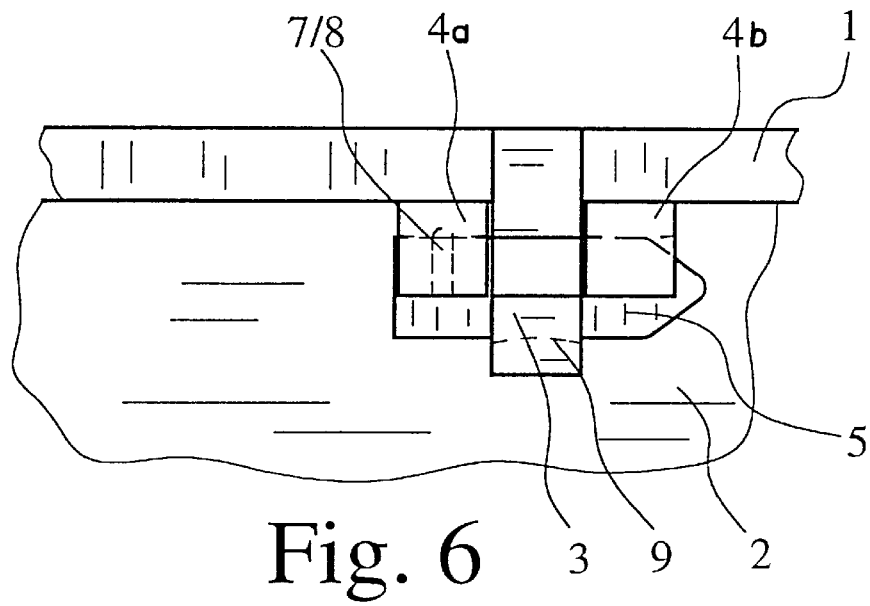
FIG. 6 is a front view of the connection recess in FIG. 2 with the connecting pin installed.

To further ensure the security of the connector pin 5 in the inserted position and prevent vibrations and other forces, which can be substantial in various applications (in a motor vehicle engine, for example), from removing the connector pin 5, the preferred embodiment of the present invention also includes a locking catch 7 on the connecting pin 5 and a lock receiver 8 on either connection recess 4a or 4b, as shown in FIG. 2 (before insertion) and FIG. 6 (after insertion).

In production, the housing cover 1 and the connection recess 3 can be produced together in a molding production step. In the like manner, the housing body 2 and the connection recesses 4a and 4b can also produced in one molding production step. The connection recesses 3, 4a and 4b are formed with predetermined dimensions to ensure that the housing cover 1 and the housing body 2 are held together in a tight and secure interface. The term "connection recess" is intened to encompass the various alternative designs possible which can act as a connection element in accordance to the present invention. Thus, although the preferred embodiment discusses a connection recess with a U-shaped cross-sectional configuration, other alternative "connection recess" designs are possible such as an eyelet or a hole configuration. However, to allow for ease in manufacturing, the preferred embodiment uses the U-shaped cross-sectional configuration which has an opening so that the injection tooling can be easily removed. This simplifies the production process by eliminating the need for additional slides which must be withdrawn if the connection recesses were closed peripherally. Therefore, both the connection recesses 3 of the housing cover 1 and the connection recesses 4a and 4b of the housing body 2 have a U-shaped cross-sectional configuration with the opening of the U pointing the opposite direction from one another.

Figure 4:
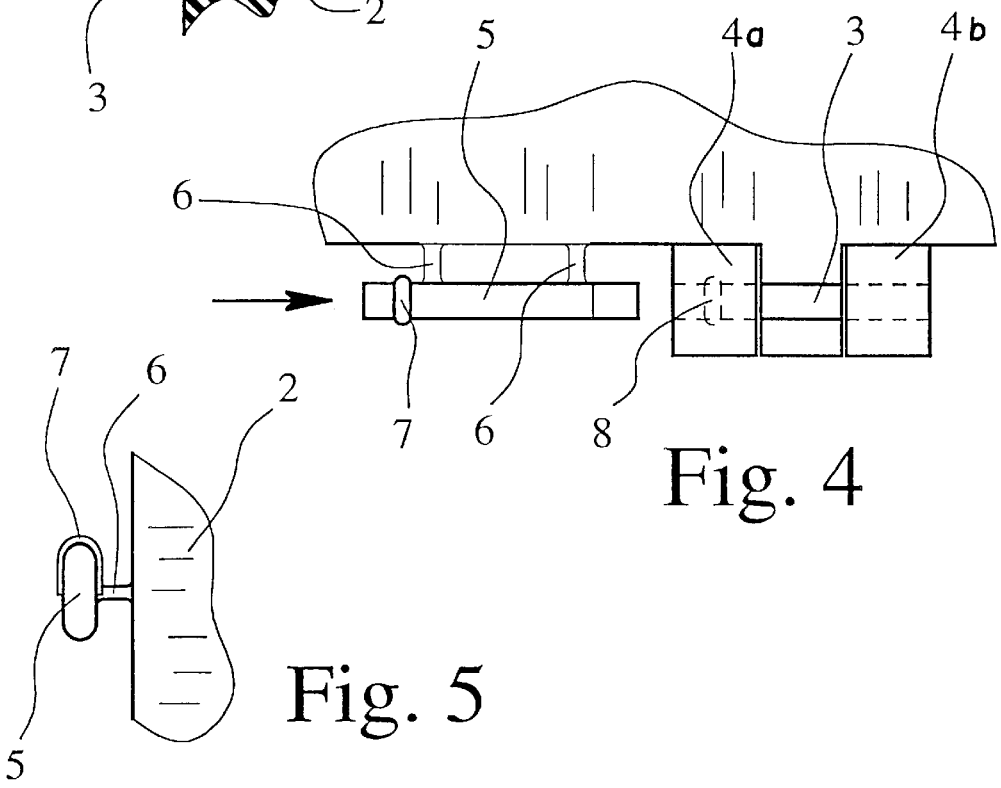
FIG. 4 is a plan view of the connection recess and the connecting pin of FIG. 2.
Figure 5:
FIG. 5 is a plan view of the connecting pin as seen in the direction of the illustrated arrow in FIG. 4, but with the correction recess omitted.

As noted above, the connector pin 5 should preferably, but not necessarily, be made from the same plastic material as the two plastic parts (in this case, the housing cover 1 and the housing body 2). This choice of material would be required for the embodiment of the present invention as shown in FIG. 4 and FIG. 5 wherein the connector pin 5 is produced jointly with the housing cover 1, or preferably, produced jointly with the housing body 2 in a molding production process. In the preferred embodiment, the connector pin 5 is connected to the housing body 2 by one or more scored support crosspiece 6 which are molded together with the connector pin 5 and the housing body 2. By producing the connector pin 5 jointly with the housing body 2 in the same mold, the production cost for connecting pin 5 can be minimized. In addition, this embodiment realizes a further advantage in that, because the connector pin 5 held by the scored support crosspiece 6, it need not be warehoused separately, but is conveniently located near where it is to be used. The connector pin 5 is detached from scored support crosspiece 6 immediately before the insertion into the pin receiving area B formed by the connection recesses 4a, 3 and 4b. In addition, the scored support crosspiece 6 can be designed such that the connector pin 5 is axially aligned relative to the pin receiving area B and detaches only when the connector pin 5 is partially inserted into the pin receiving area B. Such a design would facilitate manufacturing and while reducing cost and preventing loss of the connecting pin 5.

As discussed previously, an important advantage in using the present invention instead of a snap-in connection as is known from the prior art is that the present invention can provide a tight, reliable connection of two plastic parts without movement or "play" between the two parts. This is achieved by the axial insertion of the connecting pin 5 leading to bracing of connection recesses 3, 4 against one another and thus clamping the two plastic parts against one another. The magnitude of the bracing force is based on the inherent elasticity of the plastic parts themselves. For example, if the housing cover 1 is pressed by hand onto the housing body 2 the connector pin 5 is inserted, the bracing force would be the force caused by the elasticity of the plastic materials themselves. The magnitude of the bracing force is also based on the dimensions of the connector pin 5. By controlling the height of the connector pin 5, the amount of the bracing force can be effectively controlled. This method of controlling the magnitude of the bracing force would be more desirable in an automated or semi-automated production process and can be facilitated by providing a tapered tip on the connector pin 5 as shown in FIG. 1 and FIG. 2. In this embodiment, the tapered tip facilitates alignment and insertion of the connector pin 5. However, the actual surface of the connector pin 5 which contacts and exerts bracing force on the connection recesses 3, 4a, 4b are cylindrically shaped and are not tapered. Thus, during installation, the tapered tip of connector pin 5 initially contacts the raised arched portion 9 of the connection recess 3 and causes the housing cover 1 to be pulled down onto the housing body 2 until the housing cover 1 and the housing body 2 are joined and the pin is installed as shown in FIG. 6. As previously discussed, the arched portion 9 can of course, also be provided on the connection recesses 4a and 4b and/or on the connector pin 5.

Figure 7:
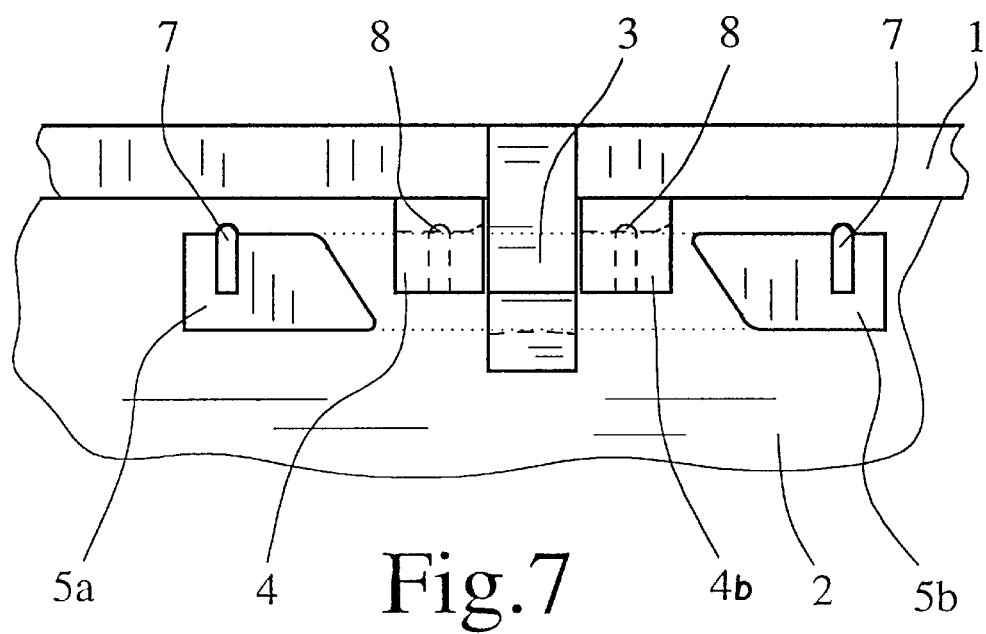
FIG. 7 is a front view of another embodiment of the present invention including a modified connecting pin.
Figure 8:
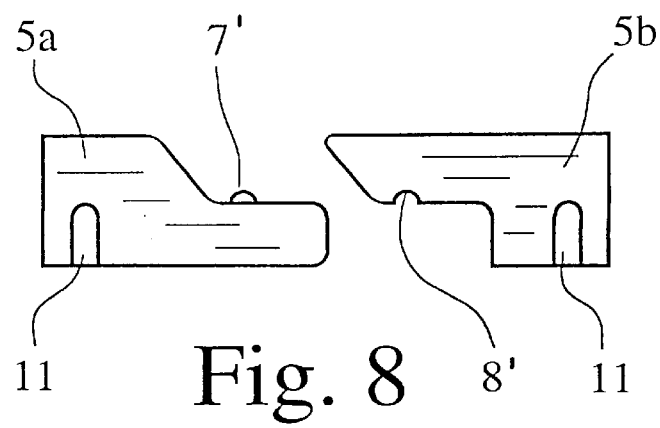
FIG. 8 is a front view of another embodiment of the connecting pin.

FIGS. 7 and 8 show an alternative design of the present invention including two piece connector pins 5a and 5b. In these embodiments, the connector pins 5a and 5b would be inserted into the connection recesses 4a and 4b respectively from opposite directions. Of course, like the previous embodiment, the two piece connector pins 5a and 5b can be molded together with the housing cover 1 or the housing body 2 and can be held in place by one or more scored support crosspiece 6. In addition, in the embodiment shown in FIG. 7, locking catches 7 and lock receivers 8 are also used to prevent the two piece connector pins 5a and 5b from slipping out because of any vibrational forces.

In the embodiment shown in FIG. 8, the two piece connector pins 5a and 5b are fixed against one another by a locking catch 7' in pin 5a and a lock receiver 8' which is located on the second connector pin 5b. In addition, in the embodiment as shown in FIG. 8, a dismounting recess 11 is provided on the connector pins 5a and 5b to facilitate the removal of the pins if desired.

As discussed previously, in the preferred embodiment, the connector pin 5 is connected to the housing body 2 by one or more scored support crosspiece 6 which is molded together with the connector pin 5 and the housing body 2. Any residual plastic material caused to be formed during molding of the connecting pin 5 and/or the scored support crosspiece 6 can be used as a reliable indicator of the material composition of the unit A and can be used as an indicator of defective composition.

The embodiment shown in FIG. 1 which has been shown further in FIGS. 2 through 6, can be small plastic housings used in industry with lateral dimensions of 20 to 100 mm and a height from 10 to 50 mm. These are, of course, only examples of the application of the present invention. The present invention can be used in other applications where connection of plastic parts are required and where these parts are to be held together in a tight and secure interface.

From the forgoing, it should now be apparent how the present invention provides a process for producing a unit, such as a small plastic housing, from two plastic parts in which the two plastic parts are held together in a tight and secure interface without "play" between the two parts. It should now also be apparent how the present invention provides a process for producing a unit from two plastic parts using a broader range of plastic materials than was previously possible with snap-in designs. It should further be clear how the present invention simplifies the production process by minimizing the number of slides required on the injection tools. As clearly shown by the Fig.s of the preferred embodiments of the present invention, two plastic parts that include connection recesses are aligned so that the connection recesses are located next to one another thereby upon insertion of a connector pin into the connection recesses, the two plastic parts are joined together.

What is claimed is:

1. A process for producing a small plastic housing from two plastic parts, comprising the steps of:

providing a first plastic part produced in a molding production step and having at least one first connection recess in a predetermined location;

providing a second plastic part produced in a molding production step and having at least one second connection recess in a predetermined location, each second connection recess being assigned to a predetermined said first connection recess, joining said first plastic part to said second plastic part with said at least one first connection recess and said at least one second connection recess adjacently positioned with respect to one another:

providing a connector pin for each adjacently positioned first and second connection recess; and inserting each connector pin into each adjacently positioned first and second connection recess in an axial insertion direction and fixedly holding the connector pin in an inserted position;

wherein said first and second connection recesses are arranged relative to each other during said joining step such that connector pin exerts bracing forces against said connection recesses in opposite directions transverse to axial insertion direction, said bracing forces producing a tight and secure interface preventing movement between the first and second plastic parts and holding said connector pin in said inserted position;

wherein said step of providing a connector pin comprises the step of producing said at least one connector pin in a molding production step jointly with at least one of said at least one first plastic part and said at least one second plastic part.

2. The process according to claim 1, wherein said producing step comprises the step of providing at least one scored support crosspiece joining said at least one connecting pin to one of said plastic parts; and wherein said at least one connector pin is separated from the scored supporting crosspiece during said inserting step.

3. The process according to claim 2, further including the step of locating said at least one scored support crosspiece such that said connector pin is axially aligned relative to said pin receiving area.

4. A housing formed of two separate plastic parts that are joinable together without play comprising:

a first plastic part including at least one first connection recess;

a second plastic part including at least one second connection recess; and at least one connector pin for insertion into a respective first connection recess and a respective second connection recess in an axial insertion direction without play and with said at least one first connection recess and said at least one second connection recess adjacently positioned with respect to one another;

wherein said first and second connection recesses are arranged relative to each other when adjacently positioned with respect to one another and have a size relative to the size of the respective connector pin such that the respective connector pin exerts bracing forces against said connection recesses in opposite directions transverse to said axial insertion direction, said bracing forces producing a tight and secure interface preventing movement between the first and second plastic parts and holding said connector pin in said inserted position;

wherein said at least one first connection recess and said at least one second connection recesses each have an opening on one side and form a pin receiving area between them when said first plastic part is joined together with said second plastic part;

wherein said at least one first connection recess and said at least one second connection recesses have a U-shaped configuration.

5. A housing formed of two separate plastic parts that are joinable together without play comprising:

a first plastic part including at least one first connection recess;

a second plastic part including at least one second connection recess; and at least one connector pin for insertion into a respective first connection recess and a respective second connection recess in an axial insertion direction without play and with said at least one first connection recess and said at least one second connection recess adjacently positioned with respect to one another;

wherein said first and second connection recesses are arranged relative to each other when adjacently positioned with respect to one another and have a size relative to the size of the respective connector pin such that the respective connector pin exerts bracing forces against said connection recesses in opposite directions transverse to said axial insertion direction, said bracing forces producing a tight and secure interface preventing movement between the first and second plastic parts and holding said connector pin in said inserted position;

further comprising at least one scored support crosspiece joining said at least one connector pin to one of said plastic parts; wherein said at least one connector pin is separatable from said scored supporting crosspiece for insertion into said pin receiving area.

6. A housing formed of two separate plastic parts that are joinable together without play comprising:

a first plastic part including at least one first connection recess;

a second plastic part including at least one second connection recess; and at least one connector pin for insertion into a respective first connection recess and a respective second connection recess in an axial insertion direction without play and with said at least one first connection recess and said at least one second connection recess adjacently positioned with respect to one another;

wherein said first and second connection recesses are arranged relative to each other when adjacently positioned with respect to one another and have a size relative to the size of the respective connector pin such that the respective connector pin exerts bracing forces against said connection recesses in opposite directions transverse to said axial insertion direction, said bracing forces producing a tight and secure interface preventing movement between the first and second plastic parts and holding said connector pin in said inserted position;

further comprising a catch on said at least one connector pin and a catch receiver on one of said at least one first connection recess and said at least one second connection recess.

7. A housing formed of two separate plastic parts that are joinable together without play comprising:

a first plastic part including at least one first connection recess;

a second plastic part including at least one second connection recess; and at least one connector pin for insertion into a respective first connection recess and a respective second connection recess in an axial insertion direction without play and with said at least one first connection recess and said at least one second connection recess adjacently positioned with respect to one another;

wherein said first and second connection recesses are arranged relative to each other when adjacently positioned with respect to one another and have a size relative to the size of the respective connector pin such that the respective connector pin exerts bracing forces against said connection recesses in opposite directions transverse to said axial insertion direction, said bracing forces producing a tight and secure interface preventing movement between the first and second plastic parts and holding said connector pin in said inserted position;

wherein said at least one second connection recess comprises at least two second connection recesses located at a predetermined distance from one another equal to a width of said at least one first connection recess, said at least one first recess fitting between said at least two second connection recesses when said first plastic part is joined together with said second plastic part;

wherein said at least one connecting pin is formed of two pin components which are inserted from opposite directions into a respective one of said at least two second connection recesses;

further comprising a scored support crosspiece joining each of said two pin components to one of said first and second plastic parts.

8. A housing formed of two separate plastic parts that are joinable together without play comprising:

a first plastic part including at least one first connection recess;

a second plastic part including at least one second connection recess; and at least one connector pin for insertion into a respective first connection recess and a respective second connection recess in an axial insertion direction without play and with said at least one first connection recess and said at least one second connection recess adjacently positioned with respect to one another;

wherein said first and second connection recesses are arranged relative to each other when adjacently positioned with respect to one another and have a size relative to the size of the respective connector pin such that the respective connector pin exerts bracing forces against said connection recesses in opposite directions transverse to said axial insertion direction, said bracing forces producing a tight and secure interface preventing movement between the first and second plastic parts and holding said connector pin in said inserted position;

wherein said at least one second connection recess comprises at least two second connection recesses located at a predetermined distance from one another equal to a width of said at least one first connection recess, said at least one first recess fitting between said at least two second connection recesses when said first plastic part is joined together with said second plastic part;

wherein said at least one connecting pin is formed of two pin components which are inserted from opposite directions into a respective one of said at least two second connection recesses;

further comprising a catch on one of said two pin components and a lock receiver on the other.

9. A housing formed of two separate plastic parts that are joinable together without play comprising:

a first plastic part including at least one first connection recess;

a second plastic part including at least one second connection recess; and at least one connector pin for insertion into a respective first connection recess and a respective second connection recess in an axial insertion direction without play and with said at least one first connection recess and said at least one second connection recess adjacently positioned with respect to one another;

wherein said first and second connection recesses are arranged relative to each other when adjacently positioned with respect to one another and have a size relative to the size of the respective connector pin such that the respective connector pin exerts bracing forces against said connection recesses in opposite directions transverse to said axial insertion direction, said bracing forces producing a tight and secure interface preventing movement between the first and second plastic parts and holding said connector pin in said inserted position;

wherein said at least one connector pin has a molded-in dismounting recess.

* * * * *